United States Patent
Chen et al.

(10) Patent No.: US 8,207,757 B1
(45) Date of Patent: Jun. 26, 2012

(54) NONVOLATILE CMOS-COMPATIBLE LOGIC CIRCUITS AND RELATED OPERATING METHODS

(75) Inventors: An Chen, Sunnyvale, CA (US); Zoran Krivokapic, Santa Clara, CA (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/022,231

(22) Filed: Feb. 7, 2011

(51) Int. Cl.
*H03K 19/20* (2006.01)

(52) U.S. Cl. ........................................ 326/104; 326/100

(58) Field of Classification Search .............. 326/37, 326/100, 104, 112
See application file for complete search history.

(56) References Cited

U.S. PATENT DOCUMENTS

| | | | | |
|---|---|---|---|---|
| 3,179,926 | A * | 4/1965 | Wolfe | ............. 365/145 |
| 4,423,339 | A | 12/1983 | Seelbach et al. | |
| 7,129,742 | B1 | 10/2006 | Kuehnel | |
| 2006/0028247 | A1 * | 2/2006 | Hara et al. | ............. 326/104 |
| 2008/0100345 | A1 * | 5/2008 | Bratkovski et al. | ............. 326/104 |
| 2009/0256588 | A1 * | 10/2009 | Lienau | ............. 326/38 |
| 2010/0073025 | A1 * | 3/2010 | Tanamoto et al. | ............. 326/41 |
| 2010/0289525 | A1 * | 11/2010 | Kawakami et al. | ............. 326/46 |
| 2011/0068825 | A1 * | 3/2011 | Xi et al. | ............. 326/47 |
| 2011/0279146 | A1 * | 11/2011 | Koo et al. | ............. 326/100 |

OTHER PUBLICATIONS

Csaba, G. "Nanocomputing by Field-Coupled Nanomagnets," IEEE Transactions on Nanotechnology, vol. 1, No. 4, Dec. 2002. pp. 209-213.
Imre, A. "Majority Logic Gate for Magnetic Quantum-Dot Cellular Automata," Science. vol. 311, Jan. 13, 2006. pp. 205-208.

* cited by examiner

*Primary Examiner* — Don Le
(74) *Attorney, Agent, or Firm* — Ingrassia Fisher & Lorenz, P.C.

(57) ABSTRACT

Apparatus and related fabrication and operating methods are provided for logic circuits that include ferromagnetic elements. An exemplary logic circuit includes a first ferromagnetic element having a first ferromagnetic layer, a second ferromagnetic element having a second ferromagnetic layer, and a transistor coupled to the first ferromagnetic element. The first transistor is configured to allow current to flow through the first ferromagnetic element. The current influences the magnetization direction of the first ferromagnetic layer, which, in turn, influences the magnetization direction of the second ferromagnetic layer.

20 Claims, 5 Drawing Sheets

US 8,207,757 B1

NONVOLATILE CMOS-COMPATIBLE LOGIC CIRCUITS AND RELATED OPERATING METHODS

TECHNICAL FIELD

Embodiments of the subject matter generally relate to elements for performing logical operations, and more particularly, relate to circuitry for performing logical operations using ferromagnetic elements and related methods for operating and fabricating the same.

BACKGROUND

Transistors, such as metal oxide semiconductor field-effect transistors (MOSFETs), are the core building block of the vast majority of electronic devices. For example, logic gates, such as NAND gates, NOR gates, and the like, may be implemented using a number of transistors configured to perform a desired logical operation. However, conventional transistor-based logic gates are volatile, requiring either the use of additional memory elements or that the transistors be continuously powered to maintain the output of the logical operation.

BRIEF SUMMARY

An apparatus is provided for a logic circuit. The logic circuit includes a first ferromagnetic element having a first ferromagnetic layer, a second ferromagnetic element having a second ferromagnetic layer, and a transistor coupled to the first ferromagnetic element. The first transistor is configured to allow current to flow through the first ferromagnetic element. The current influences the magnetization direction of the first ferromagnetic layer, which, in turn, influences the magnetization direction of the second ferromagnetic layer.

In another embodiment, a method is provided for operating a logic circuit that includes an input ferromagnetic element and an output ferromagnetic element. The method begins by activating an input transistor coupled to the input ferromagnetic element to allow an input current to flow through the input ferromagnetic element. The input current influences the magnetization direction of the input ferromagnetic element, which, in turn, influences the magnetization direction of the output ferromagnetic element. The method continues by activating an output transistor coupled to the output ferromagnetic element to allow an output current to flow through the output ferromagnetic element, wherein the magnitude of the output current is influenced by the magnetization direction of the output ferromagnetic element. The method continues by determining the magnetization direction of the output ferromagnetic element in response to the output current, and determining a digital output value for the logic circuit based on the magnetization direction of the output ferromagnetic element.

In yet another embodiment, a method is provided for fabricating a logic circuit. The method involves the steps of forming a first ferromagnetic element having a first ferromagnetic layer, forming a second ferromagnetic element having a second ferromagnetic layer, and forming a transistor coupled to the first ferromagnetic element. The transistor is configured to allow current to flow through the first ferromagnetic element. The magnetization direction of the first ferromagnetic layer is influenced by the current, wherein the second ferromagnetic element is arranged with respect to the first ferromagnetic element such that the magnetization direction of the first ferromagnetic layer influences the magnetization direction of the second ferromagnetic layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to perform logical operations using ferromagnetic elements. As described in greater detail below, one or more input ferromagnetic elements are arranged with respect to an output ferromagnetic element in a manner such that magnetization states of the input ferromagnetic elements influence the magnetization state of the output ferromagnetic element. Each input ferromagnetic element is coupled to a transistor that is operated to allow an input current to flow through the respective ferromagnetic element to configure that ferromagnetic element for a magnetization state corresponding to a particular digital input value for the logical operation, wherein the resulting magnetization state of the output ferromagnetic element indicates the digital output value of the logical operation. A transistor coupled to the output ferromagnetic element is operated to allow current to flow through the output ferromagnetic element, wherein the magnitude of the current is influenced by the magnetization state of the output ferromagnetic element, and thus, is indicative of the digital output value for the logical operation. The ferromagnetic elements maintain their magnetization states in the absence of electrical power (or current), and thus, the ferromagnetic logic circuits described herein are non-volatile and capable of maintaining the digital output value for the logical operation without consuming electrical power.

Figure 1:
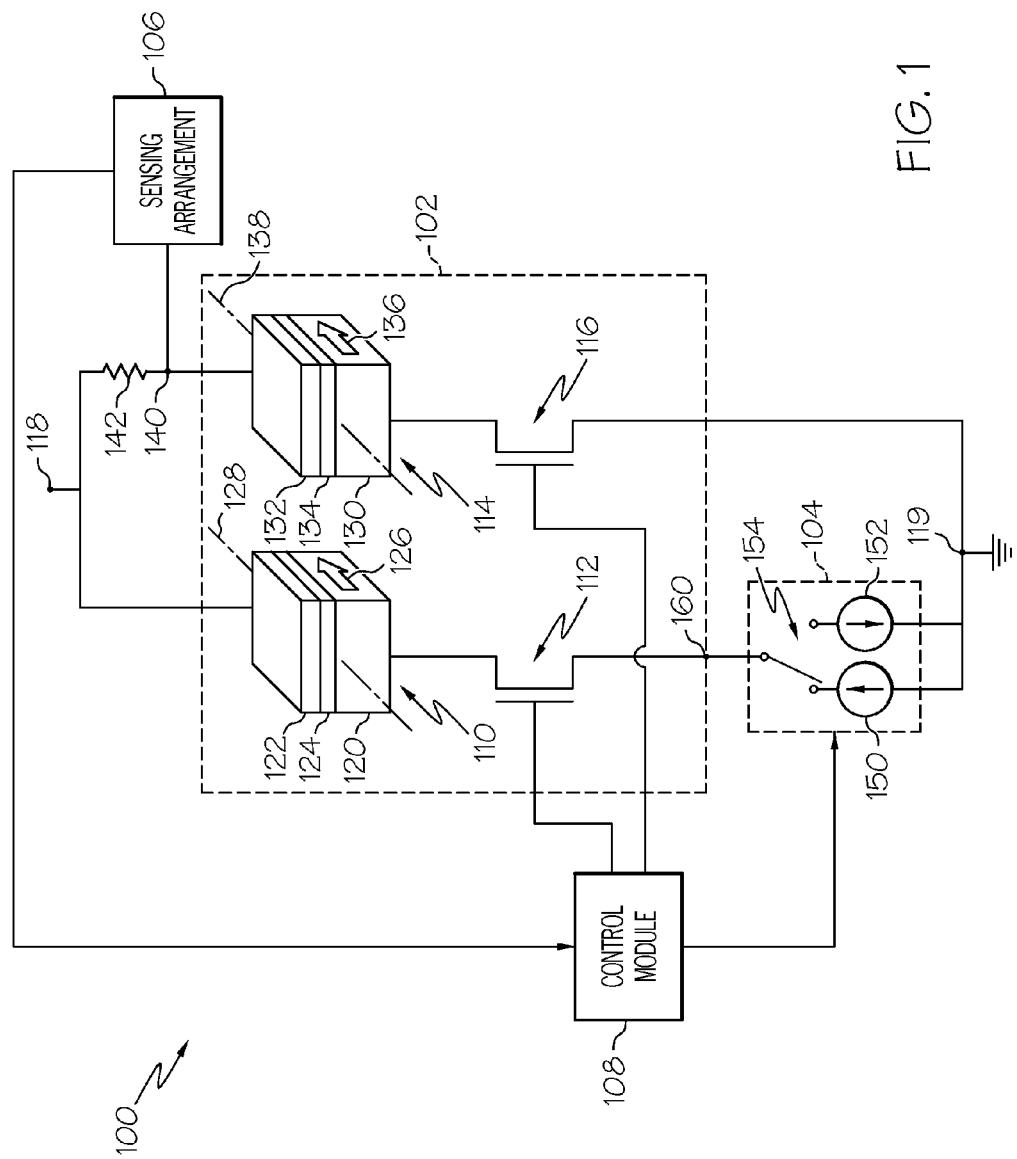
FIG. 1 is a schematic view of an exemplary embodiment of an electronic system.

FIG. 1 depicts an exemplary embodiment of an electronic system 100 for operating a logic circuit 102 that includes, without limitation, the logic circuit 102, an input current arrangement 104, a sensing arrangement 106, and a control module 108. It should be understood that FIG. 1 is a simplified representation of the electronic system 100 for purposes of explanation and ease of description, and that practical embodiments may include other devices and components to provide additional functions and features, and/or the electronic system 100 may be part of a much larger system, as will be understood. Thus, although FIG. 1 depicts direct electrical connections between circuit elements and/or terminals, alternative embodiments may employ intervening circuit elements and/or components while functioning in a substantially similar manner.

In an exemplary embodiment, the logic circuit 102 includes an input ferromagnetic element 110, an input transistor 112, an output ferromagnetic element 114, and an output transistor 116. The input ferromagnetic element 110 includes a pair of ferromagnetic layers 120, 122 separated by an insulating layer 124 to create a magnetic tunnel junction. The ferromagnetic layers 120, 122 are preferably realized as a layer of ferromagnetic metal material, such as iron, cobalt, nickel, or the like, and depending on the embodiment, the ferromagnetic layers 120, 122 may be of the same or different type of material. It should be noted that although the ferromagnetic layers 120, 122 may be described herein as individual layers of ferromagnetic material, in practical embodiments, each ferromagnetic layer 120, 122 may be composed of sub-layers of different ferromagnetic metal materials chosen to optimize the magnetic properties and/or performance of the input ferromagnetic element 110 as desired for a particular application. The first ferromagnetic layer 120 (alternatively referred to herein as the pinned layer) of the input ferromagnetic element 110 is relatively thicker than the second ferromagnetic layer 122, and is magnetized such that the first ferromagnetic layer 120 has a permanent (or fixed) direction of magnetization 126 aligned with the longitudinal axis 128 of the input ferromagnetic element 110. The insulating layer 124 is realized as a dielectric material, such as an oxide material (e.g., magnesium oxide, aluminum oxide, or the like), that is disposed between the ferromagnetic layers 120, 122, wherein the insulating layer 124 is relatively thin (e.g., typically within the range of about 1 to 2 nanometers thick) to allow electrons (i.e., electrical current) to tunnel between the ferromagnetic layers 120, 122 through the insulating layer 124. In this regard, the direction of magnetization of the second ferromagnetic layer 122 (alternatively referred to herein as the free layer) is influenced by or otherwise controlled by the direction of the tunnel current flowing between the ferromagnetic layers 120, 122.

Similarly, the output ferromagnetic element 114 includes a pair of ferromagnetic layers 130, 132 separated by an insulating layer 134 to create a magnetic tunnel junction, as described above. The output ferromagnetic element 114 is arranged with respect to the input ferromagnetic element 110 such that the magnetization direction of the free layer 132 of the output ferromagnetic element 114 is influenced by the magnetization direction of the free layer 122 of the input ferromagnetic element 110. In this regard, the output ferromagnetic element 114 and the input ferromagnetic element 110 are arranged such that the free layers 122, 132 are coplanar to maximize magnetic coupling between the free layers 122, 132. In the illustrated embodiment, the ferromagnetic elements 110, 114 are arranged with respect to one another such that the lateral axis of the output ferromagnetic element 114 (e.g., the line through the geometric center of the output ferromagnetic element 114 orthogonal to its longitudinal axis 138) is collinear with the lateral axis of the input ferromagnetic element 110 (e.g., the line through the geometric center of the input ferromagnetic element 110 orthogonal to its longitudinal axis 128). The output ferromagnetic element 114 is spaced apart from the input ferromagnetic element 110 and oriented with respect to the input ferromagnetic element 110 such that the longitudinal axis 138 of the output ferromagnetic element 114 is aligned substantially parallel to the longitudinal axis 128 of the input ferromagnetic element 110. As described in greater detail below, by virtue of the physical relationship between the free layers 122, 132, the magnetization direction of the free layer 132 of the output ferromagnetic element 114 is opposite (or magnetically antiparallel to) the magnetization direction of the free layer 122 of the input ferromagnetic element 110, such that the logic circuit 102 performs a logical NOT operation (or logical inversion). As described above, the pinned layer 120 of the input ferromagnetic element 110 is magnetized such that the pinned layer 120 has a permanent (or fixed) direction of magnetization 126 aligned with the longitudinal axis 128 of the input ferromagnetic element 110, and the pinned layer 130 of the output ferromagnetic element 114 is magnetized such that the pinned layer 130 has a permanent (or fixed) direction of magnetization 136 aligned with the longitudinal axis 138 of the output ferromagnetic element 114. In the illustrated embodiment, for a logical NOT (or logical inversion) implementation, the magnetization direction 136 of the pinned layer 130 of the output ferromagnetic element 114 is the same as (e.g., magnetically parallel or equal to) the magnetization direction 126 of the pinned layer 120 of the input ferromagnetic element 110.

In an exemplary embodiment, the output ferromagnetic element 114 effectively functions as a bistable resistive switching element capable of exhibiting either a high impedance state or a low impedance state based on the orientation of the magnetization direction of the free layer 132 with respect to the magnetization direction 136 of the pinned layer 130. For example, when the magnetization direction of the free layer 132 is in the opposite direction as the magnetization direction 136 of the pinned layer 130 (e.g., magnetically antiparallel to magnetization direction 136), the impedance of the output ferromagnetic element 114 is greater than the impedance of the output ferromagnetic element 114 when the magnetization direction of the free layer 132 is in the same direction as the magnetization direction 136 of the pinned layer 130 (e.g., magnetically parallel to magnetization direction 136). As described in greater detail below, during operation of the logic circuit 102, the impedance state of the output ferromagnetic element 114 corresponds to a digital output value for logic circuit 102. For example, the high impedance magnetization state may correspond to a logic '0' and the low impedance magnetization state may correspond to a logic '1', wherein the impedance state of the output ferromagnetic element 114 may be changed by providing an input current in the appropriate direction through the input ferromagnetic element 110 to invert or otherwise change the magnetization direction of free layer 122, and thereby invert or otherwise change the magnetization direction of free layer 132 with respect to the magnetization direction 136 of the pinned layer 130.

In an exemplary embodiment, the input transistor 112 is coupled to the input ferromagnetic element 110, and the input transistor 112 and the input ferromagnetic element 110 are configured electrically in series between a first reference voltage node 118 and a second reference voltage node 119 such that current flows in series through the input transistor 112 and the input ferromagnetic element 110. In the illustrated embodiment of FIG. 1, the free layer 122 of the input ferromagnetic element 110 is electrically connected to the first reference voltage node 118, the pinned layer 120 of the input ferromagnetic element 110 is electrically connected to a drain/source terminal of the input transistor 112, and the source/drain terminal of the input transistor 112 is connected to an input node 160 for the logic circuit 102. The input node 160 is coupled to the second reference voltage node 119 via the input current arrangement 104, which is operated to provide an input current flowing in the appropriate direction to/from the input node 160 to configure the input ferromagnetic element 110 for the magnetization state corresponding to a desired input value for the logical operation performed by the logic circuit 102. The gate terminal of the input transistor 112 is coupled to the control module 108, wherein the control module 108 operates the input transistor 112 and the input current arrangement 104 to provide the input current in the appropriate direction through the input transistor 112, which in turn, creates a corresponding tunnel current through the input ferromagnetic element 110 to control or otherwise influence the magnetization direction of the free layer 122, and thereby influences the magnetization direction of the free layer 132 of the output ferromagnetic element 114. In the illustrated embodiment, the first reference voltage node 118 is configured to receive a positive (or supply) reference voltage for the electronic system 100 and the second reference voltage node 119 is configured to receive a negative (or ground) reference voltage for the electronic system 100, wherein the input transistor 112 is realized as an N-type field effect transistor (e.g., an NMOSFET) having its drain terminal electrically connected to the pinned layer 120 and its source terminal coupled to the ground reference voltage node 119 via the input current arrangement 104. It should be appreciated that although the subject matter may be described herein in the context of an N-type (or N-channel) device implementation for transistors 112, 116, the subject matter is not intended to be limited to N-type devices and may be implemented in an equivalent manner using P-type (or P-channel) devices for transistors 112, 116.

In a similar manner, the output transistor 116 is coupled to the output ferromagnetic element 114, and the output transistor 116 and the output ferromagnetic element 114 are configured electrically in series between the reference voltage nodes 118, 119 such that an output current flows in series through the output transistor 116 and the output ferromagnetic element 114. In the illustrated embodiment of FIG. 1, the free layer 132 of the output ferromagnetic element 114 is electrically connected to an output node 140 for the logic circuit 102, the pinned layer 130 of the output ferromagnetic element 114 is electrically connected to a drain/source terminal of the output transistor 116, and the source/drain terminal of the output transistor 116 is electrically connected to the second reference voltage node 119. In the illustrated embodiment, the output transistor 116 is realized as an N-type field effect transistor having its drain terminal electrically connected to the pinned layer 130 and its source terminal electrically connected to the ground reference voltage node 119. As described in greater detail below, the output node 140 of the logic circuit 102 is coupled to the supply reference voltage node 118 via a resistive element 142 and the gate terminal of the output transistor 116 is coupled to the control module 108, wherein the control module 108 operates the output transistor 116 to allow the output current to flow through the output transistor 116, the output ferromagnetic element 114, and the resistive element 142 to identify or otherwise determine the output digital value for the logic circuit 102. By virtue of the transistors 112, 116 that interface with the ferromagnetic elements 110, 114, the logic circuit 102 is compatible with other CMOS circuits and/or CMOS logic gates. Additionally, the logic circuit 102 may be fabricated utilizing CMOS fabrication techniques, as described in greater detail below.

In the illustrated embodiment, the input current arrangement 104 includes a first current source 150 configured to provide an input current in a first direction, a second current source 152 configured to provide an input current in the opposite direction, and a switching element 154 coupled between the input current sources 150, 152 and the input transistor 112 at the input node 160 of the logic circuit 102. In an exemplary embodiment, each input current source 150, 152 is configured to provide an input current having substantially the same magnitude but in the opposite direction as the input current provided by the other input current source 150, 152. The magnitude of the input currents provided by the input current sources 150, 152 is chosen to be greater than a minimum tunnel current (or switching threshold current) needed to invert the magnetization of the free layer 122. The switching element 154 is capable of being toggled or otherwise switched between two states to selectively couple one of the input current sources 150, 152 to the input transistor 112 and/or input node 160. As described in greater detail below, in an exemplary embodiment, the control module 108 is coupled to the switching element 154 of the input current arrangement 104 and operates the switching element 154 to provide an input current to the input node 160 of the logic circuit 102 in the appropriate direction corresponding to a desired digital input value, and thereby configure the input ferromagnetic element 110 for the magnetization state corresponding to the desired digital input value.

When the switching element 154 is in a first state, the first current source 150 is configured electrically in series between the ground reference voltage node 119 and the input node 160 to provide an input current flowing in the direction from the ground reference voltage node 119 to the supply reference voltage node 118 to the source terminal of the input transistor 112. In this regard, when the input transistor 112 is turned on or otherwise activated while the switching element 154 is in the first state, the input current from the input current source 150 flows through the input transistor 112 and results in a tunnel current flowing through the input ferromagnetic element 110 from the pinned layer 120 to the free layer 122. When the tunnel current flows from the pinned layer 120 to the free layer 122, electrons flowing in the pinned layer 120 are spin polarized by virtue of the fixed magnetization direction 126 of the pinned layer 120 and apply a spin torque on electrons flowing in the free layer 122 to cause the magnetization direction of the free layer 122 to be aligned in the same direction as (or magnetically parallel to) the magnetization direction 126 of the pinned layer 120. Conversely, when the switching element 154 is in the second state, the second current source 152 is configured electrically in series between the ground reference voltage node 119 and the input node 160 to provide an input current in the direction opposite the current provided by input current source 150, that is, an input current from the input node 160 to the ground reference voltage node 119. When the input transistor 112 is turned on or otherwise activated while the switching element 154 is in the second state, the input current from the input current source 152 flows through the input transistor 112 in the direction from the supply reference voltage node 118 to the ground reference voltage node 119 and results in a tunnel current flowing through the input ferromagnetic element 110 from the free layer 122 to the pinned layer 120. When the tunnel current flows from the free layer 122 to the pinned layer 120, spin polarized electrons in the pinned layer 120 are reflected back into the free layer 122 at the interface and apply a spin torque on electrons flowing in the free layer 122 to cause the magnetization direction of the free layer 122 to be aligned in the opposite direction as (or magnetically antiparallel to) the magnetization direction 126 of the pinned layer 120.

As described above, the effective impedance of the output ferromagnetic element 114 is influenced by its magnetization state (e.g., the orientation of the magnetization direction of the free layer 132 with respect to the magnetization direction 136 of the pinned layer 130), wherein the sensing arrangement 106 is coupled to the output node 140 and configured to determine or otherwise identify the digital output value for the logical operation performed by the logic circuit 102 based on the impedance state of the output ferromagnetic element 114. As described in greater detail below, the digital output value for the logic circuit 102 is identified by turning on or otherwise activating the output transistor 116 to allow current to flow through the resistive element 142, the output ferromagnetic element 114, and the output transistor 116, wherein the magnitude of the voltage at the output node 140 is influenced by the impedance state of the output ferromagnetic element 114. In this regard, the sensing arrangement 106 is configured to identify the impedance state of the output ferromagnetic element 114 based on the magnitude of the voltage at the output node 140, and thereby, determine the magnetization direction of the free layer 132 and identify the digital value corresponding to the magnetization state of the output ferromagnetic element 114 as the digital output value for the logic circuit 102. For example, the sensing arrangement 106 may include a comparator or other suitable comparison circuitry configured to compare the voltage at the output node 140 to a threshold voltage chosen such that the voltage at the output node 140 is greater than the threshold voltage when the output ferromagnetic element 114 is in the high impedance magnetization state and less than the threshold voltage when the output ferromagnetic element 114 is in the low impedance magnetization state. In an exemplary embodiment, the resistance of the resistive element 142 is chosen such that a magnitude of the output current that flows through the resistive element 142, the output ferromagnetic element 114, and the output transistor 116 when the output transistor 116 is turned on does not meet or exceed a minimum current needed to invert the magnetization of the free layer 132 such that the magnetization direction of the free layer 132 does not change when the output transistor 116 is turned on.

In an exemplary embodiment, the control module 108 generally represents the hardware, processing logic, circuitry and/or other components of the electronic system 100 that are configured to operate the transistors 112, 116 and the switching element 154 of the input current arrangement 104 to provide the appropriate digital input values to the logic circuit 102 and/or obtain digital output values from the logic circuit 102 and/or the sensing arrangement 106, and perform additional tasks and/or functions associated with the operation of the electronic system 100 described in greater detail below. Depending on the embodiment, the control module 108 may be implemented or realized with a general purpose processor, a microprocessor, a microcontroller, a content addressable memory, a digital signal processor, a field programmable gate array, any suitable programmable logic device, discrete gate or transistor logic, discrete hardware components, or any combination thereof, designed to perform the functions described herein. In this regard, the steps of any method or algorithm described in connection with the embodiments disclosed herein may be embodied directly in hardware, in firmware, in a software module executed by the control module 108, or in any practical combination thereof.

It should be noted that FIG. 1 is a simplified representation of an electronic system 100 that includes only a single logic circuit 102 for purposes of explanation and ease of description, however, in practice, numerous logic circuits may be interconnected to implement a desired functionality. In this regard, in practical embodiments, the peripheral components of the electrical system (e.g., the input current arrangement 104, the sensing arrangement, and/or the control module 108) may be modified and shared across multiple logic circuits to reduce overhead.

Figure 2:
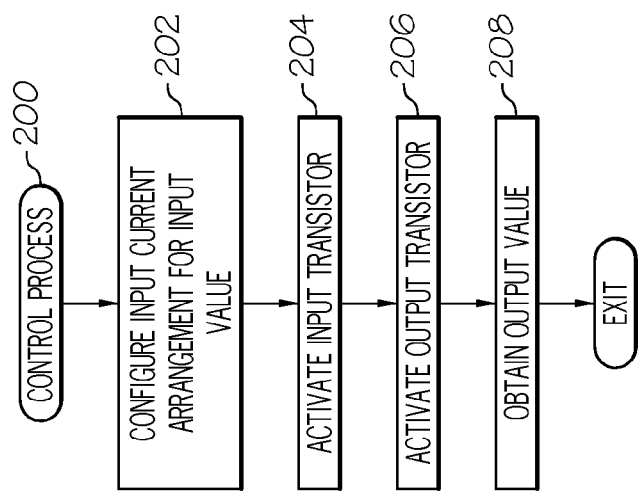
FIG. 2 is a flow diagram of an exemplary control process suitable for use with the electronic system of FIG. 1.

Referring now to FIG. 2, in an exemplary embodiment, an electronic system may be configured to perform a control process 200 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the logic circuit 102, the input current arrangement 104, the sensing arrangement 106, the control module 108, the input transistor 112, the output transistor 116, and/or the switching element 154. It should be appreciated that any number of additional or alternative tasks may be included, and may be incorporated into a more comprehensive procedure or process having additional functionality not described in detail herein.

Referring to FIG. 2, and with continued reference to FIG. 1, the control process 200 initializes or begins by configuring the input current arrangement for the desired digital input value (task 202). In this regard, the control module 108 identifies or otherwise determines the digital input value to be provided to the logic circuit 102 and configures the switching element 154 of the input current arrangement 104 to provide an input current at the input node 160 of the logic circuit 102 in the direction corresponding to the desired digital input value. For example, when the high impedance magnetization state of the output ferromagnetic element 114 corresponds to a logic '0' and the low impedance magnetization state of the output ferromagnetic element 114 corresponds to a logic '1', then an input current in the direction from the pinned layer 120 to the free layer 122 from the first input current source 150 corresponds to a logic '1' input value and an input current in the direction from the free layer 122 to the pinned layer 120 from the second input current source 152 corresponds to a logic '0' input value. In this regard, in response to identifying a desired digital input value of logic '1', the control module 108 operates the switching element 154 to couple the first input current source 150 to the input node 160, and conversely, in response to identifying a desired digital input value of logic '0', the control module 108 operates the switching element 154 to couple the second input current source 152 to the input node 160.

In an exemplary embodiment, the control process 200 continues by activating or otherwise turning on the input transistor to allow the selected input current to flow through the input ferromagnetic element (task 204). In this regard, after operating the switching element 154 to couple the appropriate input current source 150, 152 to the input node 160, the control module 108 applies or otherwise provides a voltage to the gate terminal of the input transistor 112 to turn on or otherwise activate the input transistor 112 and allow the input current from the selected input current source 150, 152 to flow through the input transistor 112 and the input ferromagnetic element 110. In an exemplary embodiment, the control module 108 provides the voltage for an amount of time that is greater than or equal to a minimum amount of time required for the magnetization direction of the free layer 122 to settle in a particular direction (e.g., either magnetically parallel to or magnetically antiparallel to magnetization direction 126) in response to the selected input current provided at the input node 160. After the input transistor 112 has been turned on for the required amount of time, the control module 108 removes the voltage from the gate terminal of the input transistor 112 (or otherwise applies a different voltage to the gate terminal of the input transistor 112) to turn off or otherwise deactivate the input transistor 112 to prevent the flow of current through the input transistor 112.

As described above, when the input current indicative of a logic '1' input value from the first input current source 150 is provided to the input node 160, the input current flows through the input ferromagnetic element 110 from the pinned layer 120 to the free layer 122, thereby causing the magnetization direction of the free layer 122 to be aligned magnetically parallel to (or equal to) the magnetization direction 126 of the pinned layer 120, resulting in the input ferromagnetic element 110 being in the low impedance magnetization state. Due to the physical relationship between free layers 122, 132, when the input ferromagnetic element 110 is in the low impedance magnetization state with a magnetization direction of the free layer 122 in the same direction as magnetization direction 126, the fringing magnetic fields from the free layer 122 of the input ferromagnetic element 110 interact with the free layer 132 of the output ferromagnetic element 114 to cause the magnetization direction of the free layer 132 to be aligned in the opposite direction, that is, in the direction opposite (or magnetically antiparallel to) magnetization directions 126, 136, resulting in the output ferromagnetic element 114 being switched to the high impedance magnetization state (or logic '0'). Conversely, when the input current indicative of a logic '0' input value from the second input current source 152 is provided to the input node 160, the input current flows through the input ferromagnetic element 110 from the free layer 122 to the pinned layer 120, thereby causing the magnetization direction of the free layer 122 to be aligned magnetically antiparallel to the magnetization direction 126 of the pinned layer 120, resulting in the input ferromagnetic element 110 being in the high impedance magnetization state. When the input ferromagnetic element 110 is in the high impedance magnetization state with a magnetization direction of the free layer 122 in the direction opposite magnetization direction 126, the fringing magnetic fields from the free layer 122 interact with the free layer 132 to cause the magnetization direction of the free layer 132 be aligned in the direction opposite the magnetization direction of the free layer 122, that is, in the same direction as (or magnetically parallel to) magnetization directions 126, 136, resulting in the output ferromagnetic element 114 being switched to the low impedance magnetization state (or logic '1').

In an exemplary embodiment, after operating the input transistor to configure the input ferromagnetic element for the desired digital input value, the control process 200 continues by activating or otherwise turning on the output transistor to allow the output current to flow through the output ferromagnetic element and obtaining the digital output value from the logic circuit (tasks 206, 208). In this regard, to obtain the result of the logical operation performed by the logic circuit 102, at any time after the input transistor 112 has been turned off or otherwise deactivated, the control module 108 applies or otherwise provides a voltage to the gate terminal of the output transistor 116 to turn on or otherwise activate the output transistor 116 and allow current to flow between the reference voltage nodes 118, 119 via the resistive element 142 and the output ferromagnetic element 114. The voltage at the output node 140 changes in response to the current flowing between the reference voltage nodes 118, 119, wherein the magnitude of the voltage at the output node 140 is influenced by the effective impedance of the output ferromagnetic element 114 which is dictated by the magnetization direction of the free layer 132. As described above, the sensing arrangement 106 is coupled to the output node 140 and determines or otherwise identifies the magnetization state (or magnetization direction of the free layer 132) based on the voltage at the output node 140, and thereby identifies the digital output value for the logic circuit 102. In this regard, when the voltage at the output node 140 is greater than a threshold voltage, the sensing arrangement 106 identifies or otherwise determines that the output ferromagnetic element 114 is in the high impedance magnetization state and thereby identifies logic '0' as the digital output value for the logic circuit 102. Alternatively, when the voltage at the output node 140 is less than the threshold voltage, the sensing arrangement 106 identifies or otherwise determines that the output ferromagnetic element 114 is in the low impedance magnetization state and thereby identifies logic '1' as the digital output value for the logic circuit 102. After activating the output transistor 116, the control module 108 obtains the digital output value for the logic circuit 102 from the sensing arrangement 106, and subsequently deactivates or turns off the output transistor 116 to prevent current flowing through the output transistor 116 between reference voltage nodes 118, 119.

Figure 3:
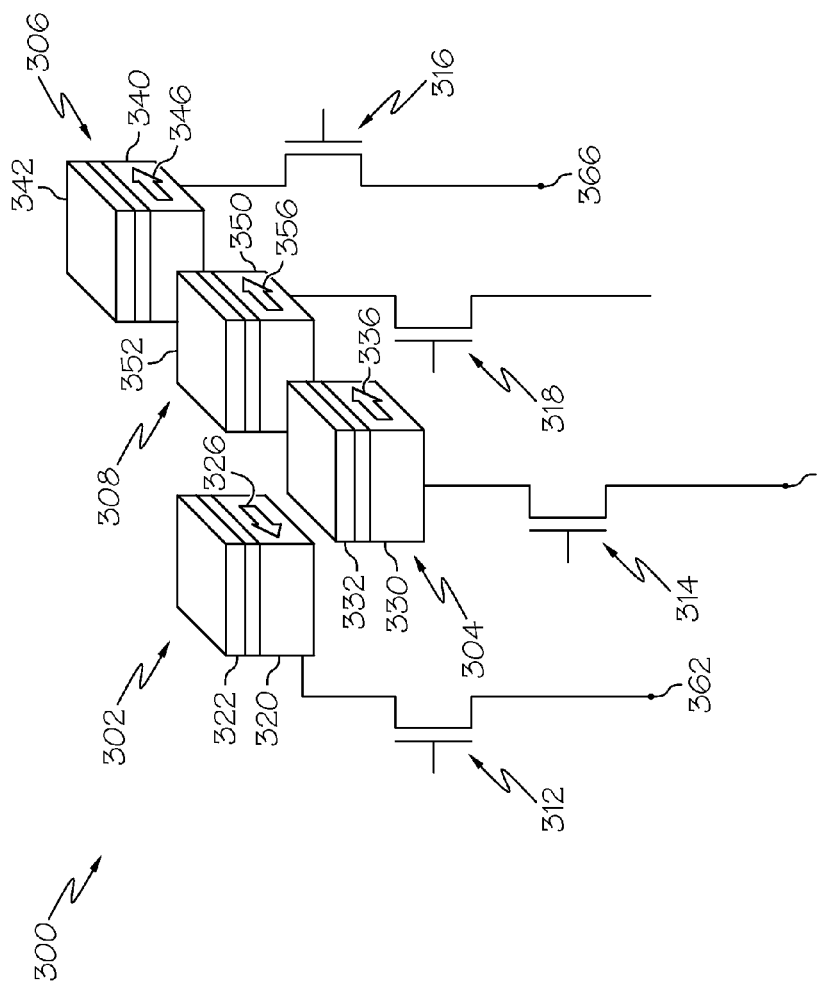
FIG. 3 is a schematic view of an exemplary embodiment of a logic circuit suitable for use in the electronic system of FIG. 1 and/or with the control process of FIG. 2 in accordance with one or more embodiments.

FIG. 3 depicts an exemplary embodiment of a logic circuit 300 configured to perform a majority function logical operation. The illustrated embodiment of the logic circuit 300 includes, without limitation, a plurality of input ferromagnetic elements 302, 304, 306, an output ferromagnetic element 308, a plurality of input transistors 312, 314, 316, and an output transistor 318. The elements of FIG. 3 are similar to counterpart elements described above in the context of FIG. 1, and the description of these common elements will not be redundantly repeated here in the context of FIG. 3. It should be understood that FIG. 3 is a simplified representation of the majority function logic circuit 300 for purposes of explanation and ease of description, and that practical embodiments may include other devices and components to provide additional functions and features, and/or the logic circuit 300 may be part of a much larger electronic system, as will be understood. Thus, although FIG. 3 depicts direct electrical connections between circuit elements and/or terminals, alternative embodiments may employ intervening circuit elements and/or components while functioning in a substantially similar manner. In this regard, it should be appreciated that although the logic circuit 300 of FIG. 3 is configured to perform the majority function based on three inputs, the subject matter is not intended to be limited to any particular number of inputs, and the logic circuit 300 may be modified to perform the majority function based on any number of inputs.

In the illustrated embodiment, the ferromagnetic elements 302, 304, 306, 308 are arranged such that their free layers 322, 332, 342, 352 are coplanar to maximize magnetic coupling between the free layers 322, 332, 342 of the input ferromagnetic elements 302, 304, 306 and the free layer 352 of the output ferromagnetic element 308. In this regard, the magnetization direction of the free layer 352 of the output ferromagnetic element 308 is influenced by the magnetization directions of the free layers 322, 332, 342 of the input ferromagnetic elements 302, 304, 306 such that the magnetization direction of the free layer 352 of the output ferromagnetic element 308 reflects the majority of the digital input values provided to the logic circuit 300, as described in greater detail below. As illustrated, the output ferromagnetic element 308 is disposed between a pair of the input ferromagnetic elements 304, 306, wherein the ferromagnetic elements 304, 306, 308 are spaced apart and arranged with respect to each other such that the longitudinal axes of the input ferromagnetic elements 304, 306 are collinear with the longitudinal axis of the output ferromagnetic element 308. The other input ferromagnetic element 302 is spaced apart from the output ferromagnetic element 308 and arranged with respect to the output ferromagnetic element 308 such that the longitudinal axis of the input ferromagnetic element 302 is substantially parallel to the longitudinal axis of the output ferromagnetic element 308 and the lateral axis of the input ferromagnetic element 302 is collinear with the lateral axis of the output ferromagnetic element 308, in a similar manner as described in the context of the ferromagnetic elements 110, 114 of FIG. 1. In the illustrated embodiment, the input ferromagnetic element 302 is magnetized such that its pinned layer 320 has a permanent direction of magnetization 326 aligned with its longitudinal axis in the direction opposite (or antiparallel to) the magnetization directions 336, 346, 356 of the remaining ferromagnetic elements 304, 306, 308.

In an exemplary embodiment, the each input ferromagnetic element 302, 304, 306 is coupled to a corresponding input node 362, 364, 366 via a respective input transistor 312, 314, 316 in a similar manner as described above in the context of FIG. 1. In this regard, the pinned layer 320 of the first element 302 is connected to the drain (or source) terminal of the first input transistor 312 and the source (or drain terminal) of the first input transistor 312 is connected to a first input node 362, the pinned layer 330 of the second ferromagnetic element 304 is connected to the drain (or source) terminal of the second input transistor 314 and the source (or drain terminal) of the second input transistor 314 is connected to a second input node 364, and the pinned layer 340 of the third ferromagnetic element 306 is connected to the drain (or source) terminal of the third input transistor 316 and the source (or drain terminal) of the third input transistor 316 is connected to a third input node 366. Each input node 362, 364, 366 is coupled to a respective input current arrangement, wherein the respective input current arrangement is operated to provide an input current at the respective input node 362, 364, 366 that flows in the appropriate direction with respect to the ferromagnetic layers of the respective input ferromagnetic element 302, 304, 306 to configure the respective input ferromagnetic element 302, 304, 306 to reflect the magnetization state corresponding to a respective digital input value for the logic circuit 300.

In a similar manner as described above in the context of FIGS. 1-2, the output ferromagnetic element 308 effectively functions as a bistable resistive switching element capable of exhibiting either a high impedance magnetization state or a low impedance magnetization state based on the majority of digital input values provided to the input ferromagnetic elements 302, 304, 306. For example, a logic '1' digital input value (e.g., a current flowing from the pinned layer 320 to the free layer 322) provided to the first input node 362 while input transistor 312 is turned on results in the magnetization direction of the free layer 322 being in the same direction as the magnetization direction 326 of the pinned layer 320. The fringing magnetic fields from the free layer 322 interact with the free layer 352 of the output ferromagnetic element 308 to cause the magnetization direction of the free layer 352 to tend to flow in the opposite direction, that is, in the same direction as (or magnetically parallel to) magnetization direction 356 and opposite (or antiparallel to) magnetization direction 326. At the same time, a logic '1' digital input value provided to the second input node 364 (e.g., a current flowing from the pinned layer 330 to the free layer 332) while the second input transistor 314 is turned on results in the magnetization direction of the free layer 332 being in the same direction as the magnetization direction 336 of the pinned layer 330. The fringing magnetic fields from the free layer 332 interact with the free layer 352 of the output ferromagnetic element 308 to cause the magnetization direction of the free layer 352 to tend to flow in the same direction, that is, in the same direction as (or magnetically parallel to) magnetization directions 336, 356 and opposite (or magnetically antiparallel to) magnetization direction 326. Conversely, a logic '0' digital input value (e.g., a current flowing from the free layer 332 to the pinned layer 330) provided to the second input node 364 results in the magnetization direction of the free layer 332 being opposite to (or magnetically antiparallel to) magnetization direction 336, which, in turn, causes the magnetization direction of the free layer 352 to tend to flow in the direction opposite to (or magnetically antiparallel to) magnetization directions 336, 356. In this manner, the fringing fields from the free layer 332 reinforce the fringing fields from the free layer 322 when the input ferromagnetic elements 302, 304 have the same magnetization state (e.g., when the digital input values provided to the input nodes 362, 364 are the same), and the fringing fields from the free layer 332 oppose the fringing fields from the free layer 322 when the input ferromagnetic elements 302, 304 have the opposite magnetization state (e.g., when the digital input values provided to the input nodes 362, 364 are different). Similarly, the fringing fields from the free layer 342 of the third ferromagnetic element 306 reinforce the fringing fields of the free layer 322 of the first element 302 and/or the free layer 332 of the second ferromagnetic element 304 when the digital input value provided to the third input node 366 is the same as the digital input value provided to the first input node 362 and/or second input node 364, and the fringing fields from the free layer 342 oppose the fringing fields of the free layer 322 and/or the free layer 332 when the digital input value provided to the third input node 366 is different from the digital input value provided to the first input node 362 and/or second input node 364.

Thus, by virtue of the physical arrangement of the input ferromagnetic elements 302, 304, 306 and their respective pinned layer magnetization directions 326, 336, 346, when a majority of the digital input values provided to the input nodes 362, 364, 366 correspond to a logic '1', the magnetization direction of the free layer 352 tends to flow in the same direction as (or magnetically parallel to) the magnetization direction 356 of the pinned layer 350 of the output ferromagnetic element 308. When the magnetization direction of the free layer 352 is in the same direction as the magnetization direction 356 of the pinned layer 350, the output ferromagnetic element 308 is in the low impedance magnetization state, and is thereby indicative of a logic '1' reflecting the majority of the digital input values provided to the input nodes 362, 364, 366 were logic '1'. Conversely, when a majority of the digital input values provided to the input nodes 362, 364, 366 correspond to a logic '0', the magnetization direction of the free layer 352 tends to flow in the opposite direction as (or magnetically antiparallel to) magnetization direction 356. When the magnetization direction of the free layer 352 is in the direction opposite the magnetization direction 356 of the pinned layer 350, the output ferromagnetic element 308 is in the high impedance magnetization state, and is thereby indicative of a logic '0' reflecting the majority of the digital input values provided to the input nodes 362, 364, 366 were logic '0'.

Figure 4:
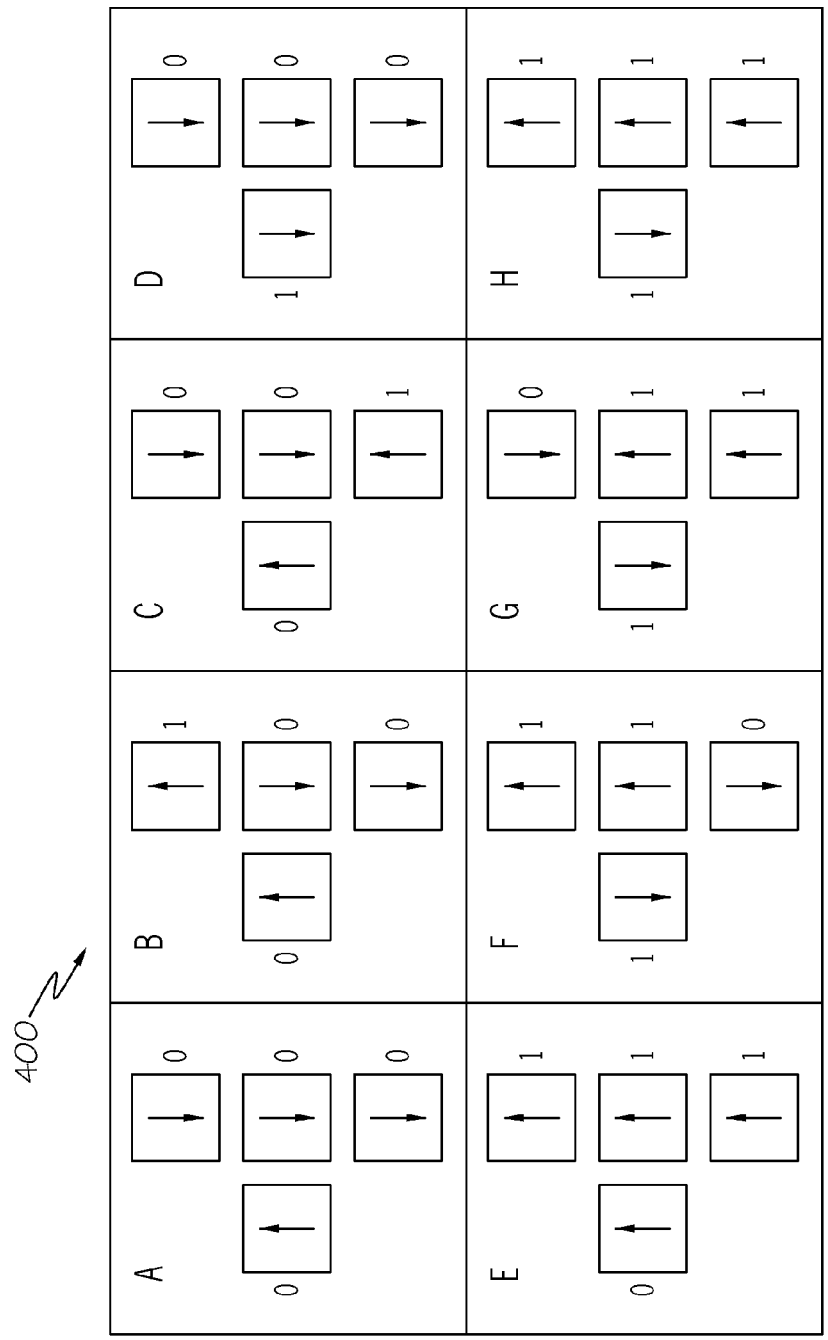
FIG. 4 depicts a table 400 illustrating possible combinations of digital input values to the logic circuit of FIG. 3 and their corresponding magnetization directions for free layers of the input ferromagnetic elements and the resultant magnetization directions for the free layer of the output ferromagnetic element in accordance with one or more embodiments.

FIG. 4 depicts a table 400 illustrating the magnetization directions of the input ferromagnetic element free layers 322, 332, 342 and the resultant magnetization direction for the free layer 352 of the output ferromagnetic element 308 for the possible combinations of digital input values provided to the logic circuit 300. As illustrated by input combination A, when logic '0' digital input values are provided to the input nodes 362, 364, 366, the magnetization direction of the free layer 322 is in the same direction as (or magnetically parallel to) the magnetization direction 356 of the pinned layer 350 and the magnetization directions of the free layers 332, 342 are in the opposite direction to (or magnetically parallel to) the magnetization direction 356 of the pinned layer 350. The fringing magnetic fields from the free layers 322, 332, 342 interact with the free layer 352 of the output ferromagnetic element 308 to cause the magnetization direction of the free layer 352 to be in the direction opposite (or magnetically antiparallel to) the magnetization direction 356 of the pinned layer 350, resulting the output ferromagnetic element 308 being in the high impedance magnetization state, and thereby indicating a logic '0' reflecting that the majority of the digital input values provided to the input nodes 362, 364, 366 were logic '0'. As illustrated by input combinations B through D, when logic '0' digital input values are provided to two of the input nodes 362, 364, 366, the magnetization directions of the free layers 322, 332, 342 interact with the free layer 352 of the output ferromagnetic element 308 to cause the magnetization direction of the free layer 352 to be in the direction opposite (or magnetically antiparallel to) the magnetization direction 356 of the pinned layer 350, thereby indicating that the majority of the digital input values provided to the input nodes 362, 364, 366 were logic '0'. As illustrated by input combinations E through H, once a majority of the digital input values provided to the input nodes 362, 364, 366 correspond to a logic '1', the magnetization directions of the free layers 322, 332, 342 interact with the free layer 352 of the output ferromagnetic element 308 to cause the magnetization direction of the free layer 352 to be aligned in the same direction as (or magnetically parallel to) the magnetization direction 356 of the pinned layer 350, resulting the output ferromagnetic element 308 being in the low impedance magnetization state, and thereby indicating a logic '1' reflecting that the majority of the digital input values provided to the input nodes 362, 364, 366 were logic '1'. In this regard, the magnetization direction of the free layer 352 and/or impedance state of the output ferromagnetic element 308 corresponds to the majority of the digital input values provided to the input nodes 362, 364, 366.

Referring now to FIGS. 1-3, as described above, the logic circuit 300 of FIG. 3 may be utilized with a control module similar to control module 108 of FIG. 1 and/or with a control process similar to the control process 200 of FIG. 2 to enable operation of the logic circuit 300. In this regard, a control module may operate input current arrangements coupled to the input nodes 362, 364, 366 to provide input currents in the appropriate directions corresponding to the desired digital input values, and provide voltages to the gate terminals of the input transistors 312, 314, 316 to turn on the input transistors 312, 314, 316 to allow the input currents to produce tunnel currents through the input ferromagnetic elements 302, 304, 306 that result in the magnetization states of the input ferromagnetic elements 302, 304, 306 corresponding to the digital input values. The control module may subsequently provide a voltage to the gate terminal of the output transistor 318 to turn on the output transistor 318 and allow current to flow through the output ferromagnetic element 308. As described above, a sensing arrangement may be utilized to determine the magnetization state of the output ferromagnetic element 308 based on the voltage across the output ferromagnetic element 308 in response to current flowing through the output ferromagnetic element 308, and thereby identify the digital output value for the majority function logical operation performed by the logic circuit 300.

Figure 5:
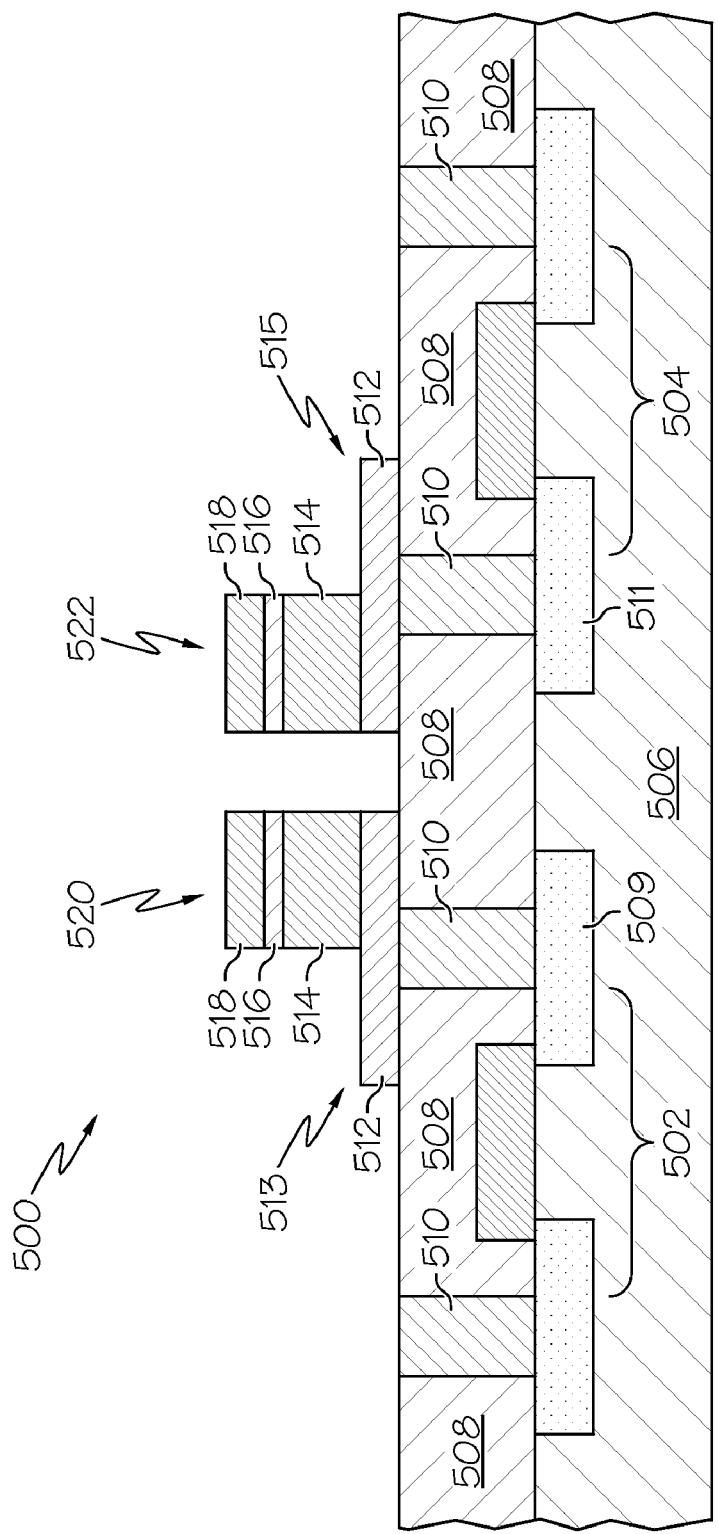
FIG. 5 is a cross-sectional view that illustrates a logic circuit structure suitable for use with the electronic system of FIG. 1 and related methods for fabricating the logic circuit structure in exemplary embodiments.

Referring now to FIG. 5, and with continued reference to FIGS. 1 and 3, fabrication of the logic circuits 102, 300 described herein may be achieved by performing one or more front end of line (FEOL) process steps to form the input/output transistors on a semiconductor substrate prior to performing one or more back end of line (BEOL) process steps to form the input/output ferromagnetic elements overlying the input/output transistors. In this regard, physical embodiments of the subject matter described herein can be realized using existing semiconductor fabrication techniques and computer-implemented design tools to generate layout designs for the masks utilized by a fabrication facility, such as a foundry or semiconductor fabrication plant (or fab), to actually manufacture the devices, apparatus, and systems described above. In practice, the layout design files used in this context can be stored on, encoded on, or otherwise embodied by any suitable non-transitory computer readable medium as computer-executable instructions or data stored thereon that, when executed by a computer, processor, of the like, facilitate fabrication of the apparatus, systems, devices and/or circuitry described herein.

For example, referring to FIG. 5, an input transistor structure 502 (e.g., input transistor 112) and an output transistor structure 504 (e.g., output transistor 116) may be formed on a semiconductor substrate 506 in a conventional manner by performing well known complementary metal-oxide-semiconductor (CMOS) FEOL process steps. After forming transistor structures 502, 504, fabrication of the logic circuit structure 500 continues by forming a layer of a dielectric material 508 (e.g., an interlayer dielectric layer) overlying the transistor structures 502, 504, and forming a conductive material 510 at appropriate locations within the interlayer dielectric layer 508 to provide electrical connections (e.g., vias) to the drain and source terminal regions of the transistor structures 502, 504. In the illustrated embodiment, fabrication of the logic circuit structure 500 continues by forming a conductive material 512 overlying the interlayer dielectric layer 508. In this regard, the conductive material 512 overlies and contacts the vias 510 such that the conductive material 512 is electrically connected to terminal regions of the transistor structures 502, 504 corresponding to the terminals of the transistor structures 502, 504 to be connected to ferromagnetic elements 520, 522 (e.g., ferromagnetic elements 110, 114) that are subsequently formed overlying the conductive material 512. For example, a layer of conductive metal material may be conformably deposited overlying the interlayer dielectric layer 508, and portions of the layer of conductive metal material may be removed while the conductive material 512 overlying the vias 510 connected to the appropriate terminal regions of the transistor structures 502, 504 remain intact. For example, a first portion 513 of the conductive metal material 512 overlies a via 510 that provides an electrical connection to the drain region 509 of the input transistor structure 502 (e.g., the drain terminal of the input transistor 112) and a second portion 515 of the conductive metal material 512 overlies a via 510 that provides an electrical connection to the drain region 511 of the output transistor structure 504 (e.g., the drain terminal of the output transistor 116). The remaining portions 513, 515 of the conductive material 512 may be designed to allow the subsequently formed ferromagnetic elements 520, 522 to be spaced apart by a distance that is less than the minimum via-to-via spacing while allowing the ferromagnetic elements 520, 522 to still be formed overlying and electrically connected to their associated transistor structures 502, 504 to avoid increasing the area footprint of the logic circuit structure 500. For example, as illustrated in FIG. 5, the distance between the ferromagnetic elements 520, 522 is less than the distance between the adjacent vias 510 that provide the electrical connections between the terminal regions 509, 511 and the ferromagnetic elements 520, 522.

After forming the conductive material 512, the fabrication process continues by forming a layer of first ferromagnetic metal material 514 overlying the logic circuit structure 500. For example, a ferromagnetic metal material 514, such as iron, cobalt, nickel, or the like, may be conformably deposited overlying conductive material 512. The first ferromagnetic metal material 514 functions as pinned layers of the ferromagnetic elements 520, 522 (e.g., pinned layers 120, 130 of ferromagnetic elements 110, 114). After forming the layer of the first ferromagnetic metal material 514, fabrication of the ferromagnetic elements 520, 522 continues by forming a layer of dielectric material 516 overlying the first ferromagnetic material 514, and forming a layer of a second ferromagnetic metal material 518 overlying the dielectric material 516. In this regard, the dielectric material 516 functions as the insulating layer (e.g., insulating layers 124, 134) of the ferromagnetic elements 520, 522 and the second ferromagnetic metal material 518 functions as the free layer (e.g., free layers 122, 132). The dielectric material 516 may be formed by conformably depositing an oxide material, such as magnesium oxide, overlying the first ferromagnetic metal material 514, and the second ferromagnetic metal material 518 may be formed by conformably depositing another ferromagnetic metal material overlying the layer of oxide material 516. As described above, the second ferromagnetic metal material 518 is preferably thinner than the first ferromagnetic metal material 514, and the thickness of the dielectric material 516 is chosen such that a tunnel current is capable of flowing between the ferromagnetic metal materials 514, 518.

After forming the second ferromagnetic metal material 518, fabrication of the ferromagnetic elements 520, 522 may be completed by performing conventional photolithography steps to form an etch mask overlying the second ferromagnetic metal material 518 that defines the ferromagnetic elements 520, 522, and etching the layers of ferromagnetic metal material 514, 518 and dielectric material 516 until reaching the interlayer dielectric layer 508 and/or conductive material 512 using the etch mask to form ferromagnetic elements 520, 522 (e.g., ferromagnetic elements 110, 114) arranged with respect to each other in the manner described above in the context of FIG. 1. In this regard, the magnetization direction of the second ferromagnetic metal material 518 of the input ferromagnetic element 520 (e.g., free layer 122 of input ferromagnetic element 110) influences the magnetization direction of the second ferromagnetic metal material 518 of the output ferromagnetic element 522 (e.g., free layer 132 of output ferromagnetic element 114). As described above, the pinned layers of the ferromagnetic elements 520, 522 (e.g., first ferromagnetic material 514) are electrically connected to the appropriate terminal regions 509, 511 of the transistor structures 502, 504 by vias 510 and conductive material 512, such that a current flowing through the input transistor structure 502 creates a tunnel current that influences the magnetization direction of the second ferromagnetic material 518 of the input ferromagnetic element 520 (which influences the magnetization direction of the second ferromagnetic material 518 of the output ferromagnetic element 522), and the magnitude of current flowing through the output transistor structure 504 is influenced by the magnetization direction of the second ferromagnetic material 518 of the output ferromagnetic element 522. After etching the layers of ferromagnetic metal materials to form the ferromagnetic elements 520, 522, a dielectric material may be conformably deposited to fill spaces between the ferromagnetic elements 520, 522 and prevent undesired electrical connections and/or physical contact between the ferromagnetic elements 520, 522, and fabrication of the logic circuit 102, 300, 500 and/or remaining elements of electronic system 100 may be completed using well known process steps, which will not be described in detail herein.

To briefly summarize, one advantage of the logic circuits described herein is that they are non-volatile, that is, a digital output value for a logical operation performed by a logic circuit is maintained by the output ferromagnetic element even in the absence of power being applied to the logic circuit because the free layer of the output ferromagnetic element is capable of maintaining its magnetization direction without power. Accordingly, because the logic circuits described herein do not need to be supplied with constant electrical power (or current), the logic circuits may be utilized to achieve reduced power (or current) consumption (e.g., by eliminating the need for standby power to maintain data), and thereby improved cost and/or efficiency. Additionally, by integrating logic functions with nonvolatile data storage, faster system speeds may be achieved for some applications because previously computed data can be maintained and reused, rather than having to repeat the processes of retrieving and computing the necessary data. At the same time, the logic circuits are compatible with existing CMOS devices and fabrication of the logic circuits may be integrated with existing CMOS fabrication processes. In this manner, nonvolatile logic gates can be implemented in CMOS architectures, and may allow for reduced power consumption and faster system speed through optimal integration of logic and memory functions. Additionally, as described above, the area footprint for the input/output ferromagnetic elements may be less than the area footprint for the input/output transistors, thereby allowing the logic circuits to be implemented without an area penalty relative to CMOS logic circuit alternatives. In this regard, device density (or information density) may be improved using an integrated fabrication process to fabricate ferromagnetic elements for the nonvolatile logic circuits within the area footprint of the input/output transistors.

For the sake of brevity, conventional techniques related to ferromagnetism, magnetic tunnel junctions, CMOS transistor fabrication processes, and other functional aspects of the subject matter may not be described in detail herein. Furthermore, the connecting lines shown in the various figures contained herein are intended to represent exemplary functional relationships and/or physical couplings between the various elements, and it should be noted that many alternative or additional functional relationships or physical connections may be present in a practical embodiment of the subject matter. Thus, although the figures may depict one exemplary arrangement of elements, additional intervening elements, devices, features, or components may be present in an embodiment of the depicted subject matter.

As used herein, a "node" means any internal or external reference point, connection point, junction, signal line, conductive element, or the like, at which a given signal, logic level, voltage, data pattern, current, or quantity is present. Additionally, certain terminology may also be used herein for the purpose of reference only, and thus is not intended to be limiting, and the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A logic circuit comprising:
   a first ferromagnetic element having a first ferromagnetic layer;
   a second ferromagnetic element having a second ferromagnetic layer; and
   a first transistor coupled to the first ferromagnetic element, wherein the first transistor is configured to allow a first current to flow through the first ferromagnetic element, the first current influencing a magnetization direction of the first ferromagnetic layer, the magnetization direction of the first ferromagnetic layer influencing a magnetization direction of the second ferromagnetic layer.

2. The logic circuit of claim 1, further comprising a second transistor coupled to the second ferromagnetic element, wherein the second transistor is configured to allow a second current to flow through the second ferromagnetic element.

3. The logic circuit of claim 2, wherein a magnitude of the second current is influenced by the magnetization direction of the second ferromagnetic layer.

4. The logic circuit of claim 1, wherein:
   the first ferromagnetic element comprises:
      a first pinned layer having a first fixed magnetization direction; and
      a first insulating layer disposed between the first pinned layer and the first ferromagnetic layer; and
   the second ferromagnetic element comprises:
      a second pinned layer having a second fixed magnetization direction; and
      a second insulating layer disposed between the second pinned layer and the second ferromagnetic layer.

5. The logic circuit of claim 4, wherein:
   the first fixed magnetization direction is aligned with a longitudinal axis of the first ferromagnetic element;
   the second fixed magnetization direction is aligned with a longitudinal axis of the second ferromagnetic element; and
   the longitudinal axis of the first ferromagnetic element and the longitudinal axis of the second ferromagnetic element are substantially parallel.

6. The logic circuit of claim 5, wherein when a direction of the first current results in the first current flowing from the first ferromagnetic layer to the first pinned layer:
   the magnetization direction of the first ferromagnetic layer is opposite the first fixed magnetization direction; and
   the magnetization direction of the second ferromagnetic layer is equal to the second fixed magnetization direction in response to the magnetization direction of the first ferromagnetic layer being opposite the first fixed magnetization direction.

7. The logic circuit of claim 5, wherein when a direction of the first current results in the first current flowing to the first ferromagnetic layer from the first pinned layer:
   the magnetization direction of the first ferromagnetic layer is equal to the first fixed magnetization direction; and
   the magnetization direction of the second ferromagnetic layer is opposite the second fixed magnetization direction in response to the magnetization direction of the first ferromagnetic layer being equal to the first fixed magnetization direction.

8. The logic circuit of claim 4, wherein:
   the magnetization direction of the first ferromagnetic layer is opposite the first fixed magnetization direction in response to the first current flowing from the first ferromagnetic layer to the first pinned layer; and
   the magnetization direction of the first ferromagnetic layer is equal to the first fixed magnetization direction in response to the first current flowing to the first ferromagnetic layer from the first pinned layer.

9. The logic circuit of claim 8, further comprising a second transistor coupled to the second ferromagnetic element, the second transistor being configured to allow a second current to flow through the second ferromagnetic element, wherein a magnitude of the second current is influenced by the magnetization direction of the second ferromagnetic layer.

10. The logic circuit of claim 1, further comprising
    a third ferromagnetic element having a third ferromagnetic layer; and
    a second transistor coupled to the third ferromagnetic element, wherein:
       the second transistor is configured to allow a second current to flow through the third ferromagnetic element, the second current influencing a magnetization direction of the third ferromagnetic layer; and
       the magnetization direction of the second ferromagnetic layer is influenced by the magnetization direction of the first ferromagnetic layer and the third ferromagnetic layer.

11. The logic circuit of claim 10, further comprising:
    a fourth ferromagnetic element having a fourth ferromagnetic layer; and
    a third transistor coupled to the fourth ferromagnetic element, wherein:
       the first current is indicative of a first digital input value;
       the second current is indicative of a second digital input value;
       the third transistor is configured to allow a third current to flow through the fourth ferromagnetic element, the third current being indicative of a third digital input value and influencing a magnetization direction of the fourth ferromagnetic layer; and the magnetization direction of the second ferromagnetic layer is indicative of a majority of the first digital input value, the second digital input value, and the third digital input value.

12. The logic circuit of claim 1, further comprising a sensing arrangement configured to identify a digital output value based on the magnetization direction of the second ferromagnetic layer.

13. A method for operating a logic circuit including an input ferromagnetic element and an output ferromagnetic element having a magnetization direction influenced by a magnetization direction of the input ferromagnetic element, the method comprising:
    activating an input transistor coupled to the input ferromagnetic element to allow an input current to flow through the input ferromagnetic element, the input current influencing the magnetization direction of the input ferromagnetic element;
    activating an output transistor coupled to the output ferromagnetic element to allow an output current to flow through the output ferromagnetic element, wherein a magnitude of the output current is influenced by the magnetization direction of the output ferromagnetic element; and
    determining the magnetization direction of the output ferromagnetic element in response to the output current; and
    determining a digital output value for the logic circuit based on the magnetization direction of the output ferromagnetic element.

14. The method of claim 13, further comprising operating an input current arrangement coupled to the input transistor to provide the input current in a direction corresponding to a digital input value.

15. The method of claim 14, the input ferromagnetic element including a first pinned layer and a first free layer and the output ferromagnetic element including a second pinned layer and a second free layer, a magnetization direction of the second free layer being influenced by a magnetization direction of the first free layer, wherein operating the input current arrangement comprises:
    operating the input current arrangement to provide the input current flowing from the first free layer to the first pinned layer in response to the digital input value corresponding to a first digital value, the input current flowing from the first free layer to the first pinned layer resulting in the magnetization direction of the first free layer being opposite a magnetization direction of the first pinned layer; and
    operating the input current arrangement to provide the input current flowing to the first free layer from the first pinned layer in response to the digital input value corresponding to a second digital value, the input current flowing to the first free layer from the first pinned layer resulting in the magnetization direction of the first free layer being equal to a magnetization direction of the first pinned layer.

16. The method of claim 13, wherein determining the magnetization direction comprises:
    obtaining a voltage across the output ferromagnetic element in response to the output current; and
    determining the magnetization direction based on the voltage across the output ferromagnetic element.

17. The method of claim 16, wherein determining the magnetization direction based on the voltage across the output ferromagnetic element comprises:
    identifying a first digital value as the digital output value when the voltage across the output ferromagnetic element is greater than a threshold voltage; and
    identifying a second digital value as the digital output value when the voltage across the output ferromagnetic element is less than the threshold voltage.

18. A method for fabricating a logic circuit, the method comprising:
    forming a first ferromagnetic element having a first ferromagnetic layer;
    forming a second ferromagnetic element having a second ferromagnetic layer, wherein the second ferromagnetic element is arranged with respect to the first ferromagnetic element such that a magnetization direction of the first ferromagnetic layer influences a magnetization direction of the second ferromagnetic layer;
    forming a first transistor coupled to the first ferromagnetic element, wherein the first transistor is configured to allow a first current to flow through the first ferromagnetic element, the first current influencing the magnetization direction of the first ferromagnetic layer; and
    forming a second transistor coupled to the second ferromagnetic element, wherein the second transistor is configured to allow a second current to flow through the second ferromagnetic element.

19. The method of claim 18, wherein forming the first ferromagnetic element comprises forming the first ferromagnetic element overlying the first transistor.

20. The method of claim 19, further comprising:
    forming a layer of dielectric material overlying the first transistor; and
    forming a via in the layer of dielectric material, the via overlying a terminal region of the first transistor, wherein forming the first ferromagnetic element comprises:
        forming a third ferromagnetic layer overlying the layer of dielectric material, the third ferromagnetic layer being electrically connected to the via;
        forming an insulating layer overlying the third ferromagnetic layer; and
        forming the first ferromagnetic layer overlying the insulating layer, wherein the first current flows between the third ferromagnetic layer and the first ferromagnetic layer.

* * * * *